(12) United States Patent
Xiaochun et al.

(10) Patent No.: US 7,834,433 B2
(45) Date of Patent: Nov. 16, 2010

(54) SEMICONDUCTOR POWER DEVICE

(75) Inventors: Tan Xiaochun, Shanghai (CN); Li Yunfang, Shanghai (CN)

(73) Assignee: Shanghai Kaihong Technology Co., Ltd., Shanghai (CN)

( * ) Notice: Subject to any disclaimer, the term of this patent is extended or adjusted under 35 U.S.C. 154(b) by 151 days.

(21) Appl. No.: 11/879,229

(22) Filed: Jul. 16, 2007

(65) Prior Publication Data

US 2008/0164590 A1    Jul. 10, 2008

(30) Foreign Application Priority Data

Jan. 10, 2007    (CN) .................. 2007 2 0066250

(51) Int. Cl.
*H01L 23/34*    (2006.01)
*H01L 21/00*    (2006.01)

(52) U.S. Cl. .............. 257/675; 257/717; 257/718; 257/706; 257/796; 257/625; 257/696; 257/E23.102; 257/E23.103; 257/E23.051; 438/122; 438/123; 438/124

(58) Field of Classification Search .......... 257/E23.004, 257/E23.043, 276, 625, 675, 696, 706–707, 257/717–719, 796, E23.014, E23.102–E23.103, 257/E23.051, E33.075, E31.131; 438/122, 438/123
See application file for complete search history.

(56) References Cited

U.S. PATENT DOCUMENTS

| | | | |
|---|---|---|---|
| 5,067,005 A * | 11/1991 | Michii et al. ................ 257/700 |
| 5,598,034 A * | 1/1997 | Wakefield .................... 257/706 |
| 6,093,960 A * | 7/2000 | Tao et al. .................... 257/706 |
| 6,404,065 B1 | 6/2002 | Choi |
| 6,534,343 B2 | 3/2003 | Choi |
| 6,583,505 B2 | 6/2003 | Choi |
| 6,710,432 B1 | 3/2004 | Pasqualini |
| 6,710,463 B2 | 3/2004 | Choi |
| 7,449,726 B2 * | 11/2008 | Nakanishi et al. ........... 257/177 |
| 2001/0041370 A1 * | 11/2001 | Brooks et al. ................. 438/2 |
| 2001/0053566 A1 * | 12/2001 | James ........................ 438/123 |
| 2002/0117764 A1 * | 8/2002 | Huang ........................ 257/796 |
| 2002/0135052 A1 * | 9/2002 | Alcoe et al. ................. 257/678 |
| 2004/0061206 A1 * | 4/2004 | Son et al. .................... 257/675 |
| 2005/0009239 A1 * | 1/2005 | Wolff et al. ................. 438/123 |
| 2006/0071271 A1 * | 4/2006 | Omura et al. ............... 257/341 |
| 2006/0151868 A1 * | 7/2006 | Zhu et al. .................... 257/690 |
| 2008/0061413 A1 * | 3/2008 | Otremba et al. ............. 257/676 |

* cited by examiner

*Primary Examiner*—Thanh V Pham
*Assistant Examiner*—Maria Ligai
(74) *Attorney, Agent, or Firm*—Chad R. Walsh; Fountainhead Law Group PC

(57) ABSTRACT

In one embodiment the present invention includes a semiconductor power device. The semiconductor power device includes a single gauge lead frame, a semiconductor die, and a heat sink. The semiconductor die is attached to a first level of the lead frame. The heat sink is attached to a second level of the lead frame. A molding compound encapsulates the semiconductor die and a portion of the lead frame, such that a portion of the heat sink is outside of the molding compound. The resulting device may be efficiently manufactured as compared to dual gauge lead frame devices or devices where the semiconductor die is not attached to the lead frame.

24 Claims, 8 Drawing Sheets

SEMICONDUCTOR POWER DEVICE

CROSS REFERENCE TO RELATED APPLICATIONS

The present application claims priority to China Application 200720066250.0, titled "A new lead frame used for high power semiconductor device", filed Jan. 10, 2007.

BACKGROUND

The present invention relates to power semiconductor devices, and in particular, to lead frames in power semiconductor devices.

Unless otherwise indicated herein, the approaches described in this section are not prior art to the claims in this application and are not admitted to be prior art by inclusion in this section.

Power semiconductor devices may be used in a variety of applications, such as voltage regulators, etc. Power semiconductor devices may be packaged in various packages, such as the TO-3 package and the TO-220 package.

The TO-220 style of electronic component package may be commonly used for transistors, silicon-controlled rectifiers, and integrated circuits. TO-220 packages commonly have three leads, although units with two, four, or five leads may also be manufactured. A semiconductor die is connected to the leads and is encapsulated within the device with molding compound. One notable feature is a metal tab or heat sink with a hole, which may be used in mounting the package case to an external heat sink. Components made in TO-220 packages can handle more power than those constructed in other packages, for example, TO-92 package cases.

In some existing device packages, the leads and the heat sink are portions of a single piece that is manipulated in the manufacturing process. It is often desirable that the thickness of the heat sink is greater than the thickness of the leads, for example, to increase the thermal dissipation ability of the heat sink without making the leads unwieldy. In such a case, a dual gauge piece may be used, with the thinner gauge portion used for the leads and the thicker gauge portion used for the heat sink. However, dual gauge pieces are more difficult to manufacture, resulting in more variation between pieces and higher costs. Furthermore, the vendor base for dual gauge lead frames may be more limited than for single gauge lead frames, which may limit flexibility and reduce economies of scale.

In some other existing device packages, the semiconductor die is not attached to the same structure as the leads, but is connected to the leads via additional structures. These additional structures may result in reduced thermal performance, i.e. increased thermal resistance, junction-to-lead. These additional structures may also result in increased forward voltage drop (which equates to reduced forward safe operating area), increased power dissipation, and possible reduction of useful lifetime or decreased long-term reliability. These additional structures may also lead to increased cost due to additional manufacturing steps or reduced number of units per hour fabricated.

In some other existing device packages, the platform onto which the die is soldered is connected to the lead via a solder bond. Solder bonds add contact resistance, which results in increased forward voltage drop, which results in many of the same negative repercussions discussed in the immediately preceding paragraph. Solder bonds also represent an area of concern for quality and reliability control. Solder bonds can break or fracture and require the assembly group to maintain good process control to properly form the solder bond.

In some other existing device packages, ground pads may exist between the bond wires and the die. Such ground pads may add contact resistance. In some other existing device packages, spacers may exist between the leads and the bond pad or platform. Such spacers may inhibit thermal flow from the leads to the bond pad or platform or heat sink.

Thus, there is a need for improved semiconductor power devices. The present invention solves these and other problems by providing semiconductor power devices with a single gauge lead frame.

SUMMARY

Embodiments of the present invention improve power semiconductor devices. In one embodiment the present invention includes a single gauge lead frame, a semiconductor die, and a heat sink. The semiconductor die is attached to a first level of the lead frame. The heat sink is attached to a second level of the lead frame. A molding compound encapsulates the semiconductor die and a portion of the lead frame, such that a portion of the heat sink is outside of the molding compound.

According to another embodiment, a method of making a packaged power semiconductor device includes providing a single gauge lead frame. The method further includes attaching a semiconductor die to the single gauge lead frame. The method further includes attaching a heat sink to the single gauge lead frame. The method further includes encapsulating the semiconductor die and a portion of the single gauge lead frame with a molding compound such that a portion of the heat sink is outside of said molding compound.

The resulting device may be efficiently manufactured as compared to dual gauge lead frame devices or devices where the semiconductor die is not attached to the lead frame.

The following detailed description and accompanying drawings provide a better understanding of the nature and advantages of the present invention.

DETAILED DESCRIPTION

Described herein are techniques for manufacturing power semiconductor devices. In the following description, for purposes of explanation, numerous examples and specific details are set forth in order to provide a thorough understanding of the present invention. It will be evident, however, to one skilled in the art that the present invention as defined by the claims may include some or all of the features in these examples alone or in combination with other features described below, and may further include modifications and equivalents of the features and concepts described herein.

In the following description, various methods and processes are described. Although the method steps may be presented in a particular order, such order is for clarity in presentation, and is not required to be followed sequentially. Method steps may be performed in other orders or in parallel as desired. When completion of a particular method step is required prior to beginning another step, such will be evident from the description or specifically noted.

Figure 1:
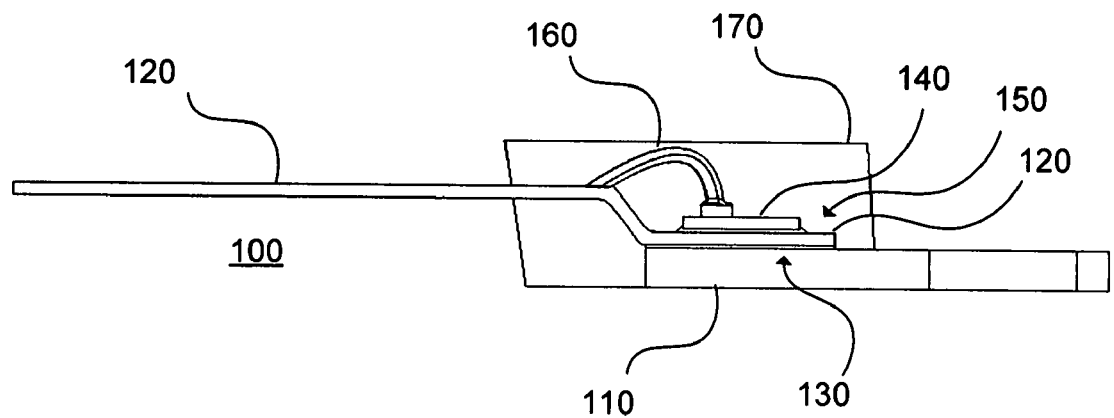
FIG. 1 is a cut away side view of a power semiconductor device according to an embodiment of the present invention.

FIG. 1 is a cut away side view of a power semiconductor device 100 according to an embodiment of the present invention. The power semiconductor device 100 includes a heat sink 110, a lead frame 120, adhesive material 130, a semiconductor die 140, die attach material 150, wire bonds 160, and encapsulation compound 170.

Figure 2:
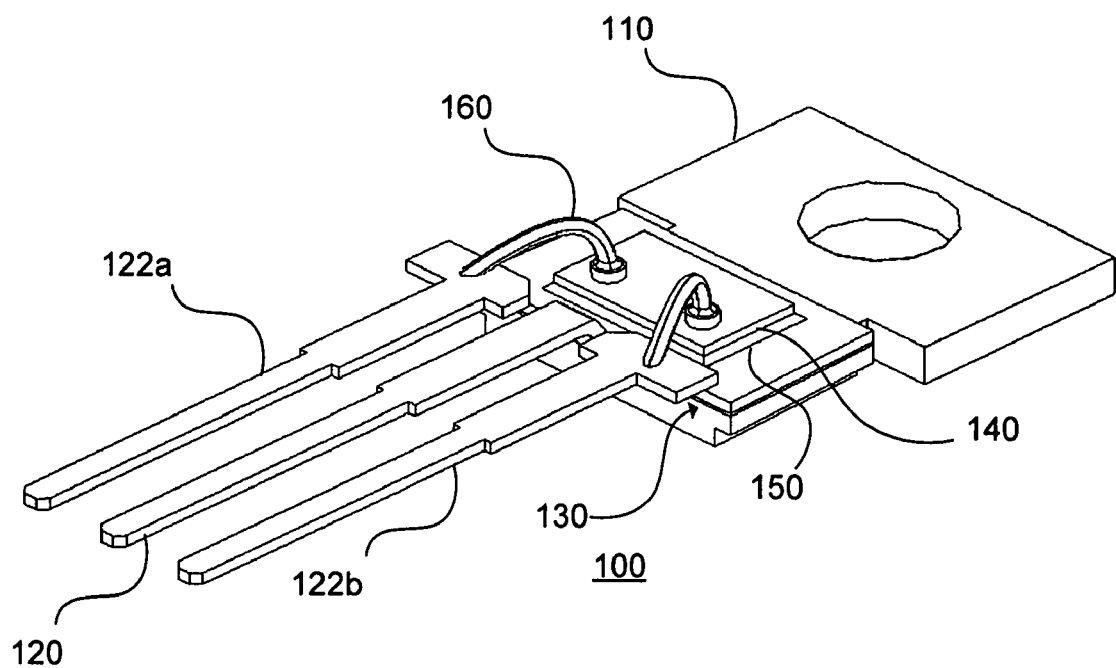
FIG. 2 is a perspective view of a power semiconductor device according to an embodiment of the present invention.

The lead frame 120 may be part of a two-level structure, with the outer leads 122a and 122b (see FIG. 2) at one level providing an attachment point for the wire bonds 160 at the same level as the center lead (see FIG. 2), and another level providing an attachment point for the semiconductor die 140. (Although the wire bonds 160 and the center lead part of the lead frame 120 are shown in FIG. 1, the view of FIG. 2 shows that the wire bonds 160 connect to the outer leads 122a and 122b.) The two-level structure may be formed by stamping the lead frame 120.

The gauge of the heat sink 110 may be greater than the gauge of the lead frame 120. In such a case, the thermal dissipation ability of the device 100 may be increased without increasing the thickness of the lead frame 120 and without requiring a dual gauge lead frame. According to another embodiment, the gauge of the heat sink 110 may be similar to the gauge of the lead frame 120, for example, within 10%.

FIG. 2 is a perspective view of the power semiconductor device 100 according to an embodiment of the present invention. (The encapsulation compound 170 is omitted.) The heat sink 110 includes a hole for attaching the device 100 to other structures, for example, to a larger heat sink. The device 100 may be so attached with a bolt, screw or clip. FIG. 2 shows that the device 100 may include three terminals; one inner terminal being part of the lead frame 120, and two outer terminals 122a and 122b connected to the semiconductor die 140 with the wire bonds 160. According to other embodiments, the number of terminals may vary.

Figure 3:
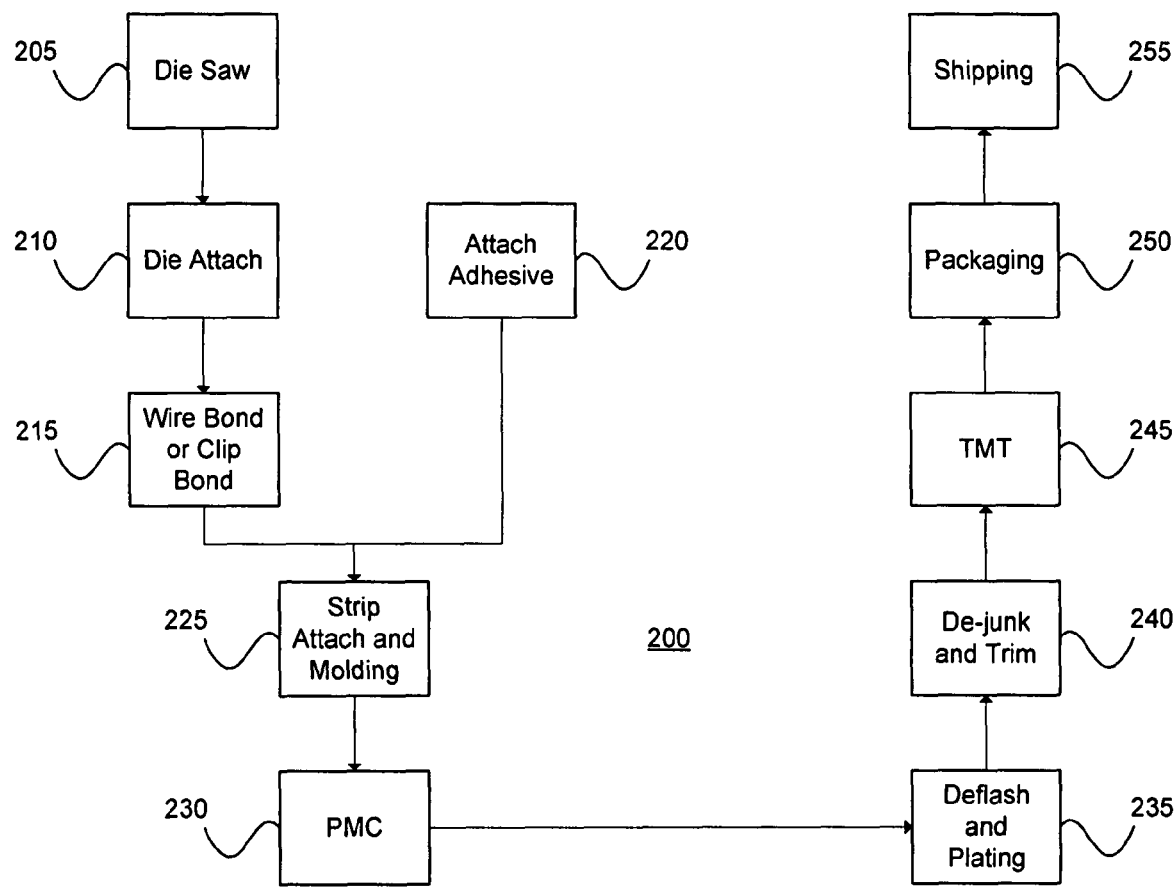
FIG. 3 is a flowchart of a method of making a power semiconductor device according to an embodiment of the present invention.

FIG. 3 is a flowchart of a method 200 of making a power semiconductor device according to an embodiment of the present invention. The method 200 may be used to make the power semiconductor device 100.

In step 205, a semiconductor wafer is provided and die sawing is performed to separate the wafer into individual semiconductor dies. According to one embodiment, the semiconductor die 140 may result from step 205.

In step 210, a lead frame is provided and die attachment is performed to attach the semiconductor die to the lead frame. The semiconductor die may be attached to the lead frame with a die attach material such as a soft solder or a silver epoxy. According to one embodiment, the semiconductor die 140 may be attached to the lead frame 120 with die attach material 150 in step 210.

In step 215, wire bonding is performed between the semiconductor die and the lead frame. The wire bonds may be made from a material such as aluminum, gold or copper. According to one embodiment, the wire bonds 160 connect the semiconductor die 140 attached to one level of the lead frame 120 to another level of the lead frame 120.

According to another embodiment, clips may be used for bonding instead of wire. bonds. Clips are more fully discussed below with reference to FIGS. 11-13.

In step 220, a heat sink is provided and an adhesive material is placed on the heat sink. The adhesive material may be an adhesive tape or an epoxy. According to one embodiment, the adhesive material 130 may be placed on the heat sink 110 in step 220. According to another embodiment, the adhesive material is omitted, and the parts are held in mechanical compression by the molding compound as it hardens; the parts may be held together in a jig in the conventional mold or automold.

In step 225, strip attachment is performed, the lead frame is attached to the heat sink using the adhesive material, and molding is performed. In strip attachment, a number of devices may be positioned onto a strip for processing. This allows a particular method step to be performed in parallel on a number of devices. According to one embodiment, the number of devices in a strip is ten; this number may be varied as desired. A molding compound may be used in molding. According to one embodiment, the molding compound 170 may be used to encapsulate the semiconductor die 140, the wire bonds 160, a portion of the lead frame 120, and a portion of the heat sink 110.

In step 230, post-mold curing (PMC) processes may be performed on the molded device. The PMC step may be omitted in certain embodiments.

In step 235, deflashing and plating processes are performed on the molded device. The plating process may use a lead-free material. In step 240, de-junking and trimming processes are performed on the molded device. If the devices are in a strip, they may be singulated at this stage. In step 245, testing, marking and tubing (TMT) processes are performed on the molded device. (The tubing process may be replaced by tape and reel processes as appropriate for other types of packages, such as D2Pak/TO-263 and DPak/TO-252. The tubing process may be appropriate for through-hole devices, and the taping process may be appropriate for surface mounted devices.) In step 250, the device is packaged, and in step 255, the device is shipped to the customer.

Figure 4:
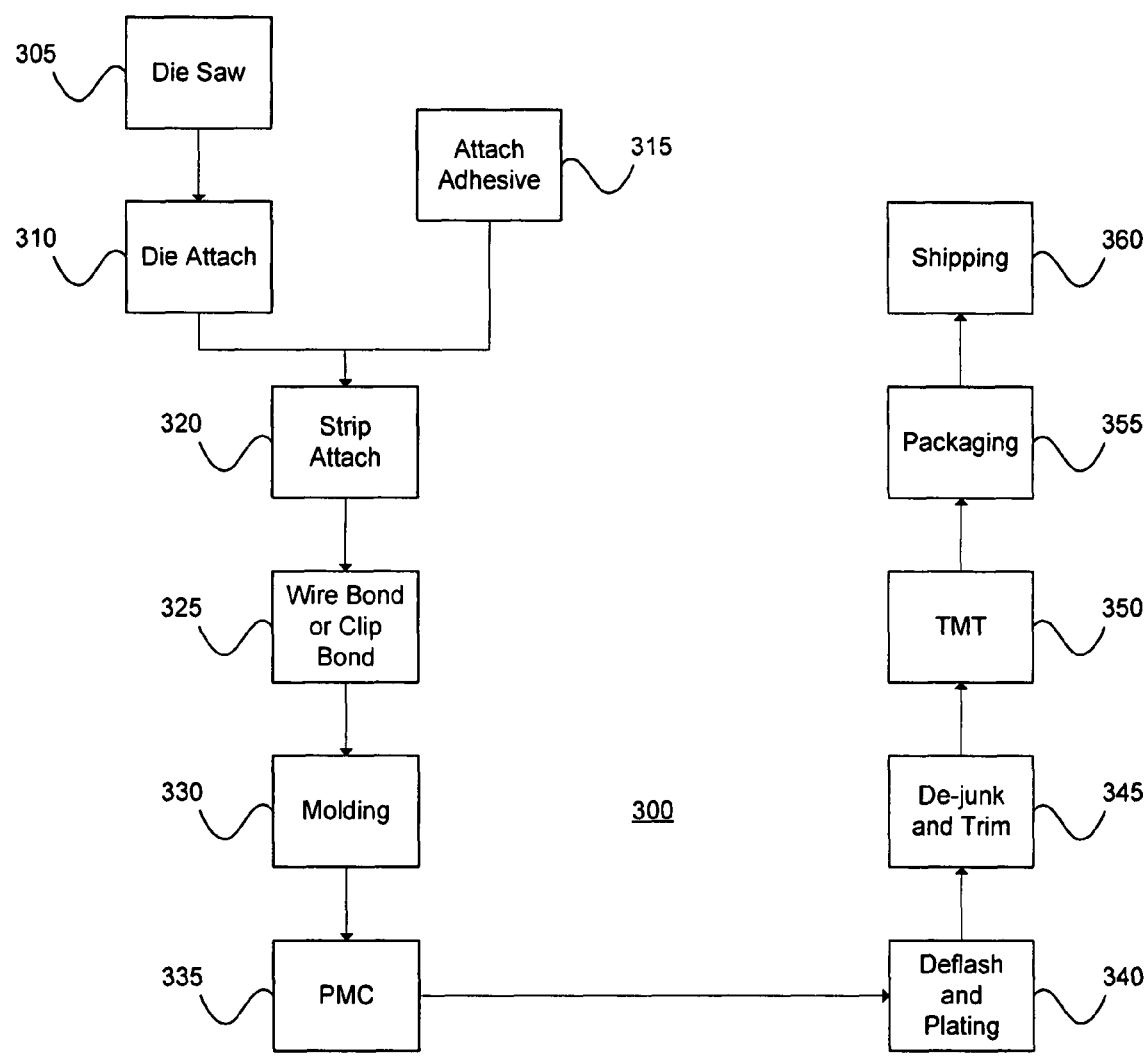
FIG. 4 is a flowchart of a method of making a power semiconductor device according to an embodiment of the present invention.

FIG. 4 is a flowchart of a method 300 of making a power semiconductor device according to an embodiment of the present invention. The method 300 is similar to the method 200 (see FIG. 3). The method 300 may be used to make the power semiconductor device 100.

In step 305, a semiconductor wafer is provided and die sawing is performed to separate the wafer into individual semiconductor dies. According to one embodiment, the semiconductor die 140 may result from step 305.

In step 310, a lead frame is provided and die attachment is performed to attach the semiconductor die to the lead frame. The semiconductor die may be attached to the lead frame with a die attach material such as a soft solder or a silver epoxy. According to one embodiment, the semiconductor die 140 may be attached to the lead frame 120 with die attach material 150 in step 310. Multiple lead frames may be provided in a strip, as discussed above, and die attachment may be performed in parallel.

In step 315, a heat sink is provided and an adhesive material is placed on the heat sink. The adhesive material may be an adhesive tape, a conductive epoxy, a non-conductive epoxy, or a silicone material. According to one embodiment, the adhesive material 130 may be placed on the heat sink 110 in step 315. As discussed above, multiple heat sinks may be provided in a strip. According to another embodiment, the adhesive material is omitted, and the parts are held in mechanical compression by the molding compound as it hardens; the parts may be held together in a jig in the conventional mold or automold.

In step 320, strip attachment is performed, and the lead frame is attached to the heat sink using the adhesive material. In strip attachment, a number of devices may be positioned onto a strip for processing. This allows a particular method step to be performed in parallel on a number of devices. According to one embodiment, the number of devices in a strip is ten; this number may be varied as desired.

In step 325, wire bonding is performed between the semiconductor die and the lead frame. The wire bonds may be made from a material such as aluminum, gold or copper. According to one embodiment, the wire bonds 160 connect the semiconductor die 140 attached to one level of the lead frame 120 to another level of the lead frame 120.

According to another embodiment, clips may be used for bonding instead of wire bonds. Clips are more fully discussed below with reference to FIGS. 11-13.

As can be seen, one difference between the method 300 and the method 200 is that in the method 200, wire bonding (step 215) is performed prior to strip attachment (step 225), whereas in the method 300, wire bonding (step 325) is performed after strip attachment (step 320). Another difference is that in the method 200, strip attachment and molding may be performed together, whereas in the method 300, strip attachment and molding are separate steps.

In step 330, molding is performed. A molding compound may be used in molding. According to one embodiment, the molding compound 170 may be used to encapsulate the semiconductor die 140, the wire bonds 160, a portion of the lead frame 120, and a portion of the heat sink 110.

In step 335, post-mold curing (PMC) processes may be performed on the molded device. The PMC step may be omitted in certain embodiments.

In step 340, deflashing and plating processes are performed on the molded device. The plating process may use a lead-free material. In step 345, de-junking and trimming processes are performed on the molded device. If the devices are in a strip, they may be singulated at this point.

In step 350, testing, marking and tubing (TMT) processes are performed on the molded device. (The tubing process may be replaced by tape and reel processes as appropriate for other types of packages, such as D2Pak/TO-263 and DPak/TO-252. The tubing process may be appropriate for through-hole devices, and the taping process may be appropriate for surface mounted devices.) In step 355, the device is packaged, and in step 360, the device is shipped to the customer.

Figure 5:
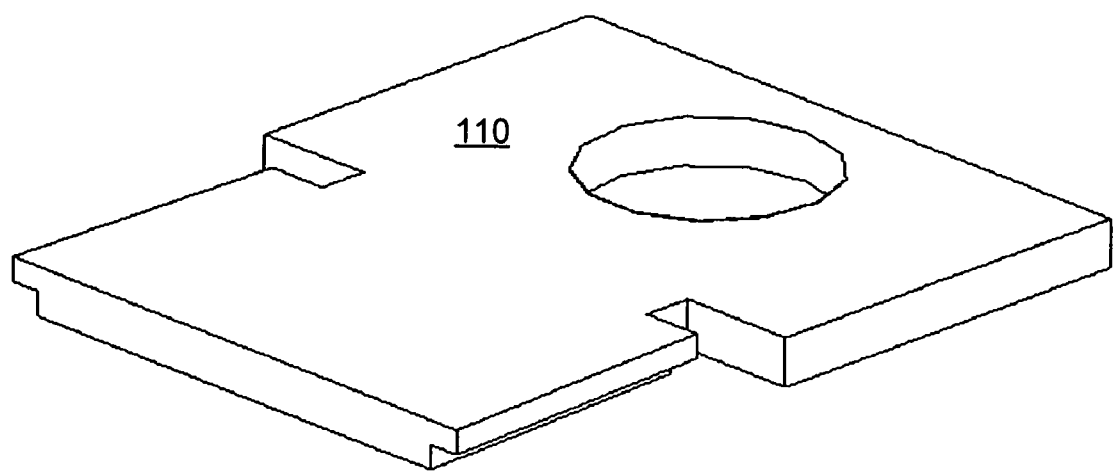
FIG. 5 is a perspective view of a heat sink according to an embodiment of the present invention.

FIG. 5 is a perspective view of the heat sink 110 according to an embodiment of the present invention. The heat sink 10 may be made from a material that conducts heat, for example, copper or aluminum. The heat sink 110 may be made from a copper alloy, such as CDA194 copper alloy. The temper of the heat sink 110 may vary, for example, including half hard and full hard tempering for the CDA194 copper alloy.

Figure 6:
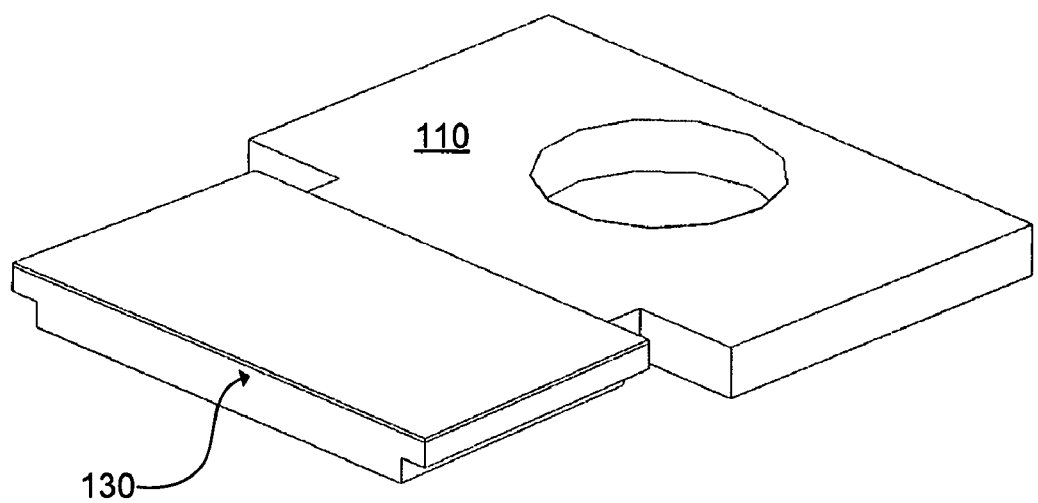
FIG. 6 is a perspective view of a heat sink and adhesive material according to an embodiment of the present invention.

FIG. 6 is a perspective view of the heat sink 110 and the adhesive material 130 according to an embodiment of the present invention. The adhesive material 130 may be an adhesive tape, a conductive epoxy, a non-conductive epoxy, or a silicone material. If the adhesive material 130 is an adhesive tape, the adhesive tape may be electrically conductive or electrically insulative The adhesive material 130 may be a conductive or non-conductive organic film. The adhesive material 130 may be a conductive or non-conductive paste, for example, the 8008HT conductive paste or 8008NC non-conductive paste or 8006NS non-conductive paste from Ablestik. The adhesive material 130 may be used to keep the heat sink 110 and the lead frame 120 in contact during the molding process (see for example step 225).

According to another embodiment, the adhesive material 130 is omitted, and the lead frame 120 and the heat sink 110 are held in direct mechanical contact (for example, touching or touching under compression) during the molding process (see for example step 225). Once the molding process has been completed, the lead frame 120 and the heat sink 110 remain in mechanical contact due to encapsulation by the molding compound 170. In such an embodiment, the steps 220 and 225 are modified to remove the adhesive material.

Figure 7:
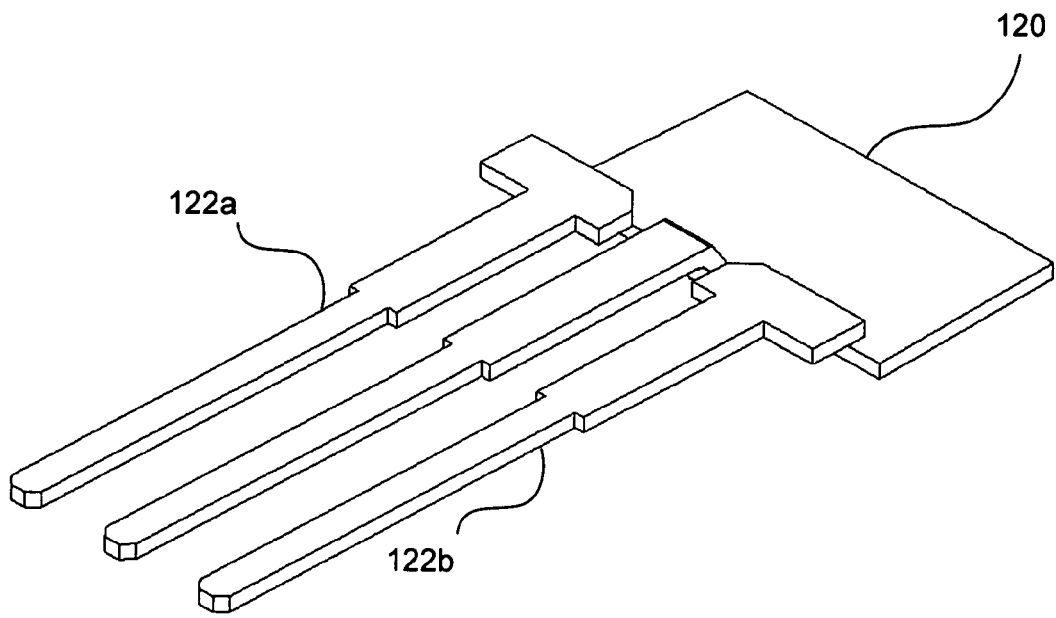
FIG. 7 is a perspective view of a lead frame according to an embodiment of the present invention.

FIG. 7 is a perspective view of the lead frame 120 according to an embodiment of the present invention. The lead frame 120 may be constructed from a sheet of a conductive material such as copper or a copper alloy. The lead frame 120 may be etched, stamped or punched to achieve the desired outline. The lead frame 120 may be viewed as two portions, a lead portion and a bond pad portion. The lead portion includes the center lead, and the bond pad portion includes a bond pad that provides an attachment place for the semiconductor die.

The leads may be connected to the bond pad portion, or not, depending upon the desired operational characteristics of the device 100. For example, in the embodiment shown in FIG. 7, the center lead is connected to the bond pad portion, and the two outer leads 122*a* and 122*b* are not. (The two outer leads 122*a* and 122*b* are connected via the bond wires 160, as can be seen in FIG. 2.) For embodiments in which a lead is not connected to the bond pad portion, the leads may be clamped in a finger-like metal jig for proper placement prior to wire bonding and encapsulation.

The lead frame 120 may be constructed from a single gauge material. Single gauge materials include materials with a thickness that does not vary more than 10% between the thickest portion and the thinnest portion.

Figure 8:
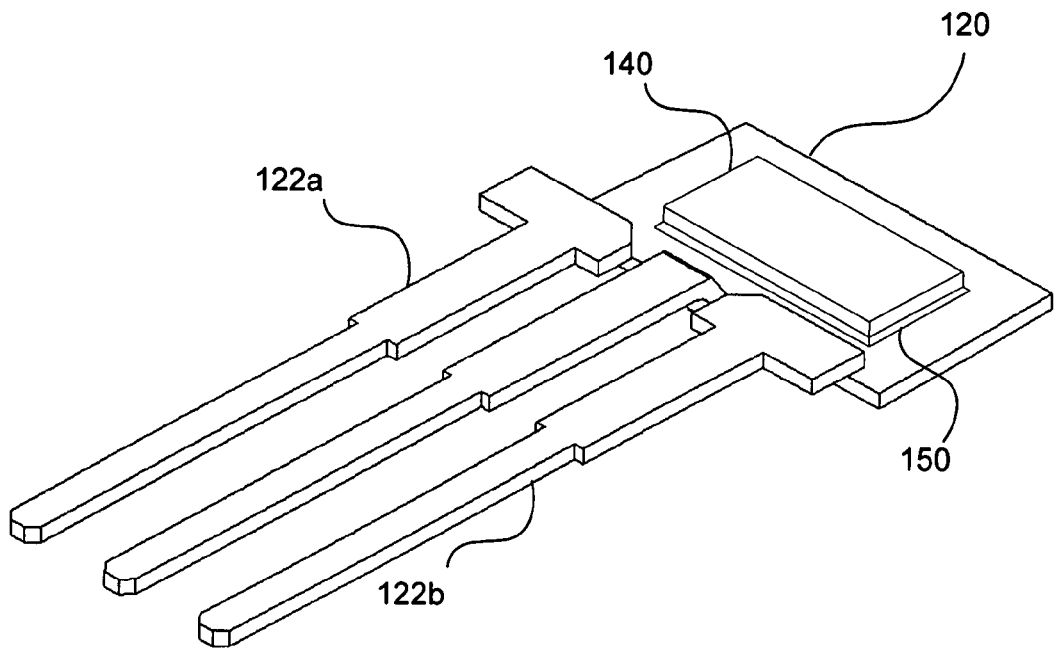
FIG. 8 is a perspective view of a lead frame with a semiconductor die attached with die attach material according to an embodiment of the present invention.

FIG. 8 is a perspective view of the lead frame 120 with the semiconductor die 140 attached with the die attach material 150 according to an embodiment of the present invention. The embodiment shown in FIG. 8 may result from the step 210, for example. The die attach material 150 may be electrically conductive or electrically insulative.

Figure 9:
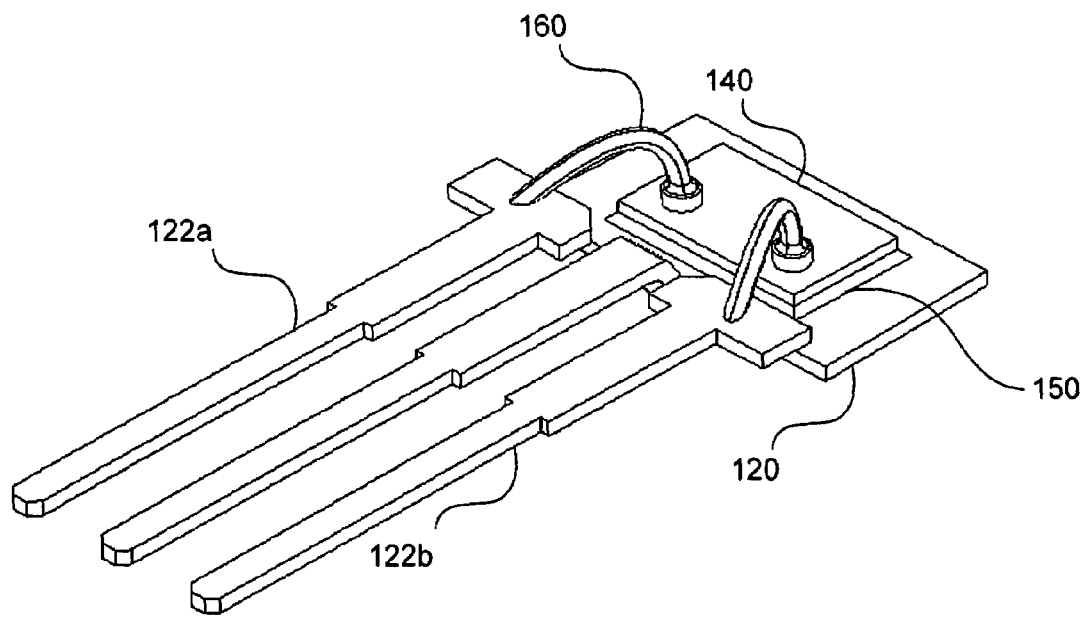
FIG. 9 is a perspective view of a lead frame, a semiconductor die, and wire leads according to an embodiment of the present invention.

FIG. 9 is a perspective view of the lead frame 120, the semiconductor die 140, and the wire leads 160 according to an embodiment of the present invention. The embodiment shown in FIG. 9 may result from the step 215, for example.

Figure 10:
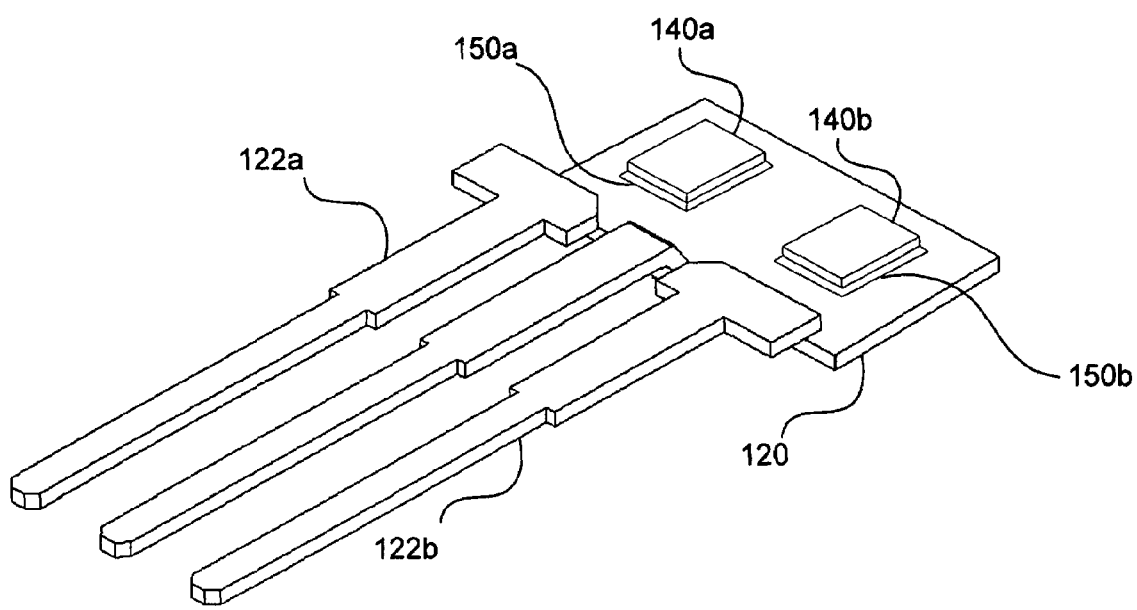
FIG. 10 is a perspective view of a lead frame with a dual semiconductor die according to an embodiment of the present invention.

FIG. 10 is a perspective view of the lead frame 120 with a dual semiconductor die 140*a* and 140*b* according to an embodiment of the present invention. Die attach material portions 150*a* and 150*b* connect the semiconductor dies 140*a* and 140b to the lead frame 120. Various design choices impact whether to use a single die or more than one die. Using two dice has the advantage of typically being able to take advantage of some existing mask set and/or wafer inventory or work in progress, which allows samples to be built faster, get the product qualified, and ship it to the market sooner. However, using two single chips results in two die placement operations. Each die placement may reduce the units per hour rate of assembly, and decreased units per hour equates to increased cost. Also, two chips may not utilize the available space on the lead frame as effectively, since more space may be alloted to prevent the second chip from striking the first chip on its way down in the second die placement. Some room may have to be allotted for solder to flow out from under each chip and not interfere with the adjacent chip. All of this may occupy more of the space than one dual anode chip would occupy. However, a dual anode chip may require a new set of photolithography masks to be fabricated, which may have some fixed non-recurring engineering cost associated with it. The dual anode chip may also involve processes to fab-out and qualify the dual anode chip, which may create dedicated inventory that represents a liability. The dual-die embodiment of FIG. 10 may be otherwise manufactured as detailed regarding method 200 or method 300.

Figure 11:
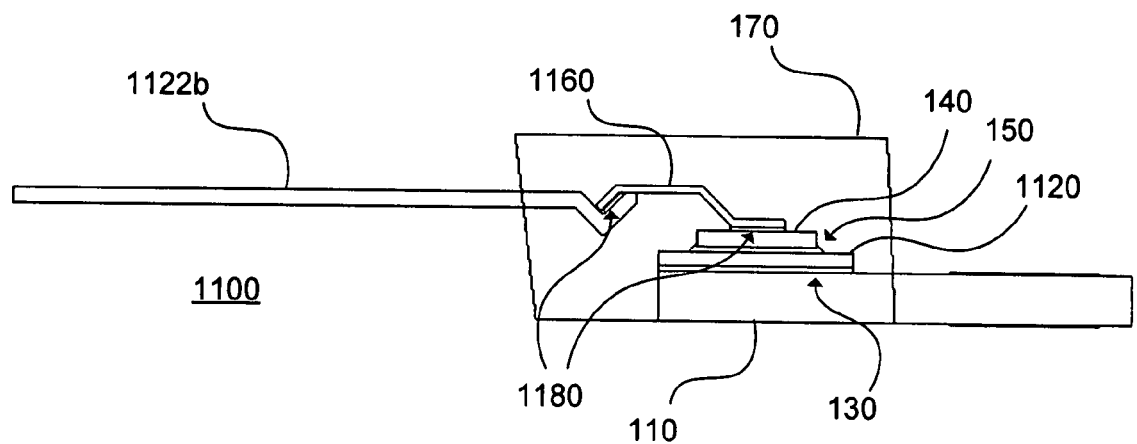
FIG. 11 is a cut away side view of a power semiconductor device according to an embodiment of the present invention.

FIG. 11 is a cut away side view of a power semiconductor device 1100 according to an embodiment of the present invention. The power semiconductor device 1100 is similar to the device 100, except that the wire bonds 160 of the device 100 are replaced by clips 1160 in the device 1100. The device 1100 also includes a lead frame 1120 and adhesive 1180. One outer lead 1122b can be seen in FIG. 11. (Both outer leads 1122a and 1122b can be seen in FIG. 12.) The other components with similar reference numbers are as described above.

Figure 12:
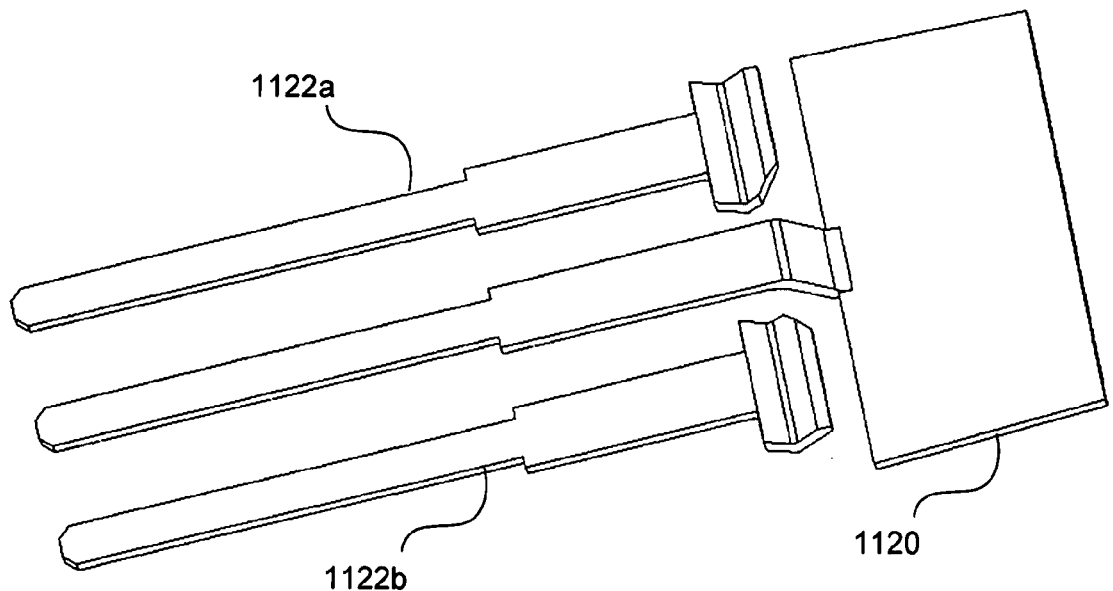
FIG. 12 is a perspective view of a lead frame according to an embodiment of the present invention.

FIG. 12 is a perspective view of the lead frame 1120 according to an embodiment of the present invention. One difference between FIG. 12 and FIG. 7 is that the outer leads 1122a and 1122b have grooves. These grooves may be referred to as v-grooves. The v-grooves help to hold the clips 1160 in position.

Figure 13:
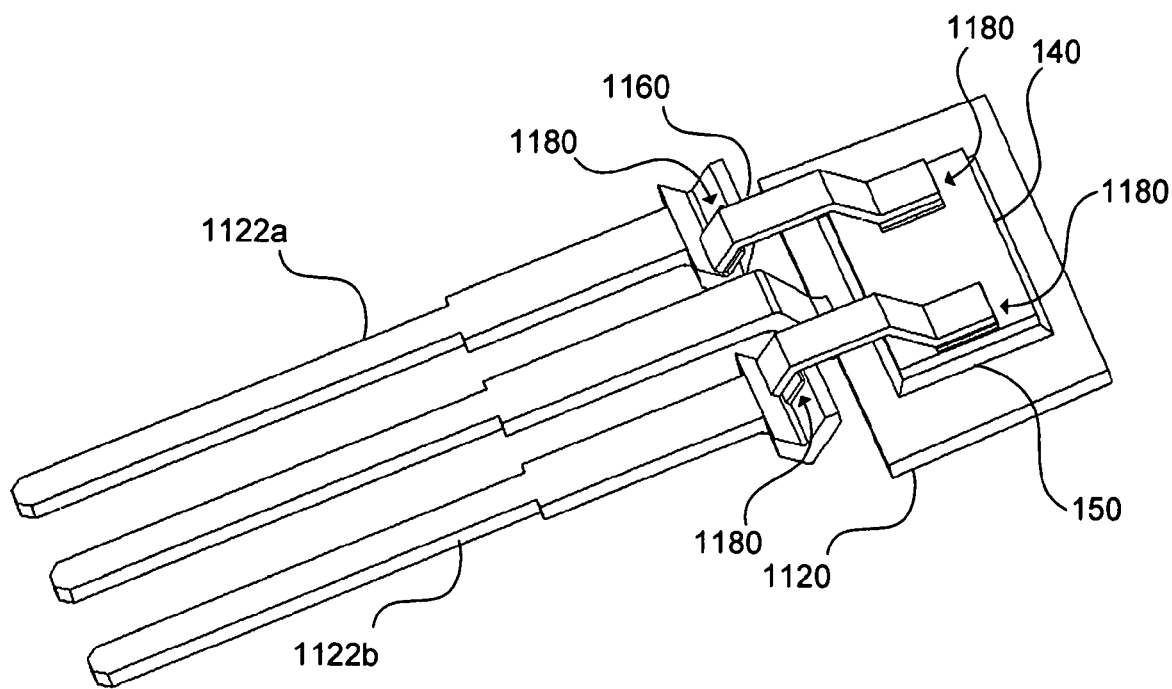
FIG. 13 is a perspective view of a lead frame, a semiconductor die, and clips according to an embodiment of the present invention.

FIG. 13 is a perspective view of the lead frame 1120, the semiconductor die 140, and clips 1160 according to an embodiment of the present invention.

The clips 1160 may be made from a conductive material such as a metal or metal alloy. The clips 1160 may be made from a copper alloy such as CDA194. The tempering of the copper alloy may include half hard tempering or full hard tempering.

The adhesive 1180 attaches the clips 1160 to the lead frame 1120 and to the semiconductor die 1140. The adhesive 1180 may be a solder paste. The solder paste may be applied into the v-groove and then reflowed to form a solder bond between the clip 1160 and the lead frame 1120. The solder paste may be a composition of materials, such as 92.5% lead, 5% silver and 2.5% tin, and may be purchased from vendors such as Umicore or Indium Corp. The adhesive 1180 may be an epoxy material.

The materials used for the adhesive 1180 may also be used as the materials for the die attach material 150. For example, solder may be used as both the die attach material and the clip attach material. The same material need not be used both as the adhesive 1180 and the die attach material 150.

The method of making the device 1100 is very similar to the method 200 or method 300 described above, with the following differences. Instead of wire bonding (step 215 or step 325), the adhesive 1180 is applied to the v-grooves in of the lead frame 1120 and to the semiconductor die 140, and the clip 1160 is then placed in the adhesive to connect between the lead frame 1120 and the semiconductor die 140.

Devices that have clip bonding may result in a number of differences from devices that have wire bonding. A more repeatable assembly process may be performed for clip bonding devices, resulting in less variation between devices. Clip bonding devices may have a higher surge current capacity. Clip bonding devices may have less contact resistance and less forward voltage drop, resulting in lower power dissipation. Wire bonding devices may have more design flexibility, since a specific size of clip may be more suitable for a specific size of die. Wire bonding may be performed at a higher rate than clip bonding, resulting in a higher number of units per hour produced. Finally, there may be more suppliers for wire bond raw materials than for clips.

The embodiment shown in FIG. 13 shows a two clip version that is suitable for large die dual devices. Large die dual devices are generally between 58 mils and 110 mils and have either two single chips (one under each clip; compare to FIG. 10) or one dual anode chip. According to another embodiment, there is only one clip with one die under it, resulting in a device that is not a common cathode configuration. According to another embodiment, a wide single clip may be used, resulting in a single element device (not dual anode common cathode duals).

As discussed above, embodiments of the present invention include a number of advantages. Thermal dissipation may be increased without requiring a dual gauge lead frame, reducing the manufacturing complexity, variation and cost of the lead frame.

In addition, the type of the adhesive material 130 may be varied according to the desired performance characteristics of the device 100. For example, if the heat sink 110 is to be electrically coupled to the lead frame 120, an electrically conductive tape may be used as the adhesive material 130. If the heat sink 110 is to be electrically isolated from the lead frame 120, an electrically insulative tape may be used as the adhesive material 130.

Similarly, the type of the die attach material 150 may be varied according to the desired performance characteristics of the device 100. For example, if the semiconductor die 140 is to be electrically coupled to the lead frame 120, an electrically conductive tape may be used as the die attach material 150. If the semiconductor die 140 is to be electrically isolated from the lead frame 120, an electrically isolative tape may be used as the die attach material 150.

The material of the heat sink 110 may differ from the material of the lead frame 120. A lower cost material such as aluminum may be used for the heat sink 110 without impacting the material-based functionality of the lead frame 120. Materials with greater electrical or thermal conductivity than the material used for the lead frame may be used for the heat sink. For example, silver or gold may be used for the heat sink and copper may be used for the lead frame. This type of structure, although likely to be more expensive than a traditional ITO-220 package, would have superior performance. Adding flexibility on the material also provides some degree of immunity to the fluctuations of raw material costs. For example, if the cost of copper increases, but the cost of stainless steel plunges, stainless steel may be used for the heat sink.

Although the specific packages TO-220 and ITO-220 have been discussed above, similar principles may be applied to other types of power semiconductor device packages, such as variants of the TO-220 (including TO-220AC and TO-220AB), D2Pak (TO-263), TO-3P, TO-247, and DPak (TO-252).

The above description illustrates various embodiments of the present invention along with examples of how aspects of the present invention may be implemented. The above examples and embodiments should not be deemed to be the only embodiments, and are presented to illustrate the flexibility and advantages of the present invention as defined by the following claims. Based on the above disclosure and the following claims, other arrangements, embodiments, implementations and equivalents will be evident to those skilled in the art and may be employed without departing from the spirit and scope of the invention as defined by the claims.

What is claimed is:

1. A packaged power semiconductor device, comprising:
    a single gauge lead frame comprising:
        a first level including one or more leads; and
        a second level;
    a semiconductor die attached to an upper surface of said second level of said single gauge lead frame;
    a heat sink, having an upper surface attached to a lower surface of said second level of said single gauge lead frame, and a portion of a lower surface of the heat sink includes a recess from a first edge of the heat sink to define an extended portion having a wall portion and a ceiling portion, wherein the first level of the single gauge lead frame projects from a second edge of the heat sink that is coupled to the first edge of the heat sink at a corner; and
    a molding compound that encapsulates said semiconductor die and a portion of said single gauge lead frame, wherein the lower surface of said heat sink below the single gauge lead frame is outside of said molding compound,
    wherein the heat sink is exposed from the molding compound on portions of the upper surface and the lower surface of the heat sink in a region that is not directly below the single gauge lead frame;
    wherein a third edge of the second level of the single gauge lead frame and the first edge of the heat sink are in line with each other, and
    wherein a first distance from the third edge of the second level of the single gauge lead frame to the die is greater than a second distance from the wall portion of the extended portion to the die.

2. The packaged power semiconductor device of claim 1, further comprising:
    a wire bond between said semiconductor die and said first level of said single gauge lead frame.

3. The packaged power semiconductor device of claim 1, further comprising:
    a conductive clip between said semiconductor die and said first level of said single gauge lead frame.

4. The packaged power semiconductor device of claim 1, further comprising:
    an adhesive tape between said single gauge lead frame and said heat sink.

5. The packaged power semiconductor device of claim 1, further comprising:
    a conductive epoxy between said single gauge lead frame and said heat sink.

6. The packaged power semiconductor device of claim 1, further comprising:
    a non-conductive epoxy between said single gauge lead frame and said heat sink.

7. The packaged power semiconductor device of claim 1, further comprising:
    a silicone material between said single gauge lead frame and said heat sink.

8. The packaged power semiconductor device of claim 1, wherein said heat sink is attached to said single gauge lead frame such that electricity and heat are conducted therebetween.

9. The packaged power semiconductor device of claim 1, wherein said heat sink is attached to said single gauge lead frame such that heat is conducted therebetween.

10. The packaged power semiconductor device of claim 1, wherein said heat sink comprises an aluminum heat sink.

11. The packaged power semiconductor device of claim 1, wherein said heat sink comprises a copper heat sink.

12. The packaged power semiconductor device of claim 1, wherein said heat sink comprises a copper alloy heat sink.

13. The packaged power semiconductor device of claim 1, wherein a gauge of said single gauge lead frame is less than a gauge of said heat sink.

14. The packaged power semiconductor device of claim 1, wherein a gauge of said single gauge lead frame is similar to a gauge of said heat sink.

15. The packaged power semiconductor device of claim 1, further comprising:
    another semiconductor die attached to said single gauge lead frame, wherein said molding compound encapsulates said another semiconductor die.

16. The packaged power semiconductor device of claim 1, wherein the second level of the single gauge lead frame is a rectangular shape, wherein the upper surface of the heat sink that is attached to the lower surface of said second level of said single gauge lead frame is of a same rectangular shape.

17. The packaged power semiconductor device of claim 1, wherein the third edge is a flat edge.

18. The packaged power semiconductor device of claim 1, wherein the portions of the upper surface and the lower surface of the heat sink are contiguously attached to a portion of the heat sink directly below the lead frame.

19. A method of making a packaged power semiconductor device, comprising the steps of:
    providing a single gauge lead frame comprising a first level and a second level, the first level including one or more leads;
    attaching a semiconductor die to an upper surface of said second level of said single gauge lead frame;
    attaching an upper surface of a heat sink to a lower surface of said second level of said single gauge lead frame, wherein a portion of a lower surface of the heat sink includes a recess from a first edge of the heat sink to define an extended portion having a wall portion and a ceiling portion, wherein the first level of the single gauge lead frame projects from a second edge of the heat sink that is coupled to the first edge of the heat sink at a corner;
    encapsulating said semiconductor die and a portion of said single gauge lead frame with a molding compound wherein the lower surface of said heat sink below the signal gauge lead frame is outside of said molding compound,
    wherein the heat sink is exposed from the molding compound on portions of the upper surface and the lower surface of the heat sink in a region that is not directly below the single gauge lead frame;
    wherein a third edge of the second level of the single gauge lead frame and the first edge of the heat sink are in line with each other, and
    wherein a first distance from the third edge of the second level of the single gauge lead frame to the die is greater than a second distance from the wall portion of the extended portion to the die.

20. The method of claim 19, further comprising:
stamping said single gauge lead frame to form a two-level structure.

21. The method of claim 19, further comprising:
performing wire bonding between said semiconductor die and said first level of said single gauge lead frame.

22. The method of claim 19, further comprising:
attaching a conductive clip between said semiconductor die and said first level of said single gauge lead frame.

23. The method of claim 19, further comprising:
attaching another semiconductor die to said single gauge lead frame, wherein said step of encapsulating further includes encapsulating said another semiconductor die.

24. The method of claim 19, wherein the portions of the upper surface and the lower surface of the heat sink are contiguously attached to a portion of the heat sink directly below the lead frame.

\* \* \* \* \*